United States Patent
Chen et al.

(10) Patent No.: US 8,106,462 B2
(45) Date of Patent: Jan. 31, 2012

(54) BALANCING NFET AND PFET PERFORMANCE USING STRAINING LAYERS

(75) Inventors: Xiangdong Chen, Poughquag, NY (US);
Weipeng Li, Hopewell Junction, NY (US); Anda C. Mocuta, Hopewell Junction, NY (US); Dae-Gyu Park, Hopewell Junction, NY (US); Melanie J. Sherony, Hopewell Junction, NY (US); Kenneth J. Stein, Hopewell Junction, NY (US); Haizhou Yin, Hopewell Junction, NY (US); Franck Arnaud, Hopewell Junction, NY (US); Jin-Ping Han, Fishkill, NY (US); Laegu Kang, Hopewell Junction, NY (US); Yong Meng Lee, Woodlands (SG); Young Way Teh, Singapore (SG); Voon-Yew Thean, Fishkill, NY (US); Da Zhang, Hopewell Junction, NY (US)

(73) Assignees: International Business Machines Corporation, Armonk, NY (US);
Freescale Semiconductor, Inc., Austin, TX (US); Infineon Technologies North America Corp., Milptas, CA (US);
Chartered Semiconductor Manufacturing Ltd., Singapore (SG)

( * ) Notice: Subject to any disclaimer, the term of this patent is extended or adjusted under 35 U.S.C. 154(b) by 193 days.

(21) Appl. No.: 12/687,374

(22) Filed: Jan. 14, 2010

(65) Prior Publication Data
US 2011/0169096 A1 Jul. 14, 2011

(51) Int. Cl.
*H01L 27/092* (2006.01)

(52) U.S. Cl. ......... 257/369; 257/E21.632; 257/E27.062; 438/199

(58) Field of Classification Search ................... 257/369, 257/E21.632, E27.062; 438/199
See application file for complete search history.

(56) References Cited

U.S. PATENT DOCUMENTS

| | | | |
|---|---|---|---|
| 6,815,317 B2 | 11/2004 | Schafbauer et al. | |
| 7,183,613 B1* | 2/2007 | Zhu et al. | 257/351 |
| 7,521,308 B2 | 4/2009 | Nair et al. | |
| 7,525,162 B2 | 4/2009 | Yin et al. | |
| 2009/0289280 A1 | 11/2009 | Zhang et al. | |
| 2009/0291540 A1 | 11/2009 | Zhang et al. | |
| 2009/0298297 A1* | 12/2009 | Kanarsky et al. | 438/761 |
| 2010/0261323 A1* | 10/2010 | Chen et al. | 438/199 |
| 2011/0198670 A1* | 8/2011 | Ramani et al. | 257/192 |

OTHER PUBLICATIONS

U.S. Appl. No. 12/859,664, filed Aug. 19, 2010 Title: Methods of forming CMOS transistors using tensile stress layers and hydrogen plasma treatment.

* cited by examiner

*Primary Examiner* — Trung Q Dang
(74) *Attorney, Agent, or Firm* — Gibb I.P. Law Firm, LLC; Yuanmin Cai, Esq.

(57) ABSTRACT

An integrated circuit structure includes a substrate and at least one pair of complementary transistors on or in the substrate. The pair of complementary transistors comprises a first transistor and a second transistor. The structure also includes a first stress-producing layer on the first transistor and the second transistor, and a second stress-producing layer on the first stress-producing layer over the first transistor and the second transistor. The first stress-producing layer applies tensile strain force on the first transistor and the second transistor. The second stress-producing layer applies compressive strain force on the first stress-producing layer, the first transistor, and the second transistor.

20 Claims, 2 Drawing Sheets

BALANCING NFET AND PFET PERFORMANCE USING STRAINING LAYERS

BACKGROUND OF THE INVENTION

1. Field of the Invention

The embodiments presented herein generally relate to integrated circuit structures and more particularly relate to methods and structures that utilize novel stress-producing layers over transistors.

2. Description of Related Art

As integrated circuit structures such as transistors evolve, it has been discovered that placing physical strain (compression or tensile stress) upon the channel region of field effect transistors (FETs) can improve the performance of some types of transistors. Such stress producing or straining layers generally change their size as they cool, which produces the physical strain on the transistors.

Further advances in transistor technologies have developed dual stress liner applications where one type of transistor is covered where one type of strain producing layer and a complimentary type of transistor is covered with a different type of straining layer. For complete discussion of such dual stress liner features, see U.S. Pat. No. 7,525,162, incorporated herein by reference.

BRIEF SUMMARY OF THE INVENTION

Various method and structure embodiments are disclose herein. One embodiment comprises an integrated circuit structure that includes a substrate and at least one pair of complementary transistors on or in the substrate. The pair of complementary transistors comprises a first transistor and a second transistor. The structure also includes a first stress-producing layer on the first transistor and the second transistor, and a second stress-producing layer on the first stress-producing layer over the first transistor and the second transistor. The first stress-producing layer applies tensile strain force on the first transistor and the second transistor. The second stress-producing layer applies compressive strain force on the first stress-producing layer, the first transistor, and the second transistor.

Another embodiment comprises an integrated circuit structure that includes a substrate and at least one pair of complementary transistors on or in the substrate. The pair of complementary transistors comprises a first transistor and a second transistor. The structure also includes a first stress-producing layer on both the first transistor and the second transistor, and a second stress-producing layer on the first stress-producing layer over both the first transistor and the second transistor. The first stress-producing layer applies tensile strain force on the first transistor and the second transistor. The second stress-producing layer applies compressive strain force on the first stress-producing layer, the first transistor, and the second transistor. The first stress-producing layer and the second stress-producing layer can be of different thicknesses, and the difference in thickness between the first stress-producing layer and the second stress-producing layer alters performance of the first transistor and the second transistor.

One exemplary method embodiment of manufacturing an integrated circuit structure forms at least one pair of complementary transistors on or in a wafer. The pair of complementary transistors comprise a first transistor and a second transistor. The method forms a first stress-producing layer on both the first transistor and the second transistor. The first stress-producing layer applies tensile strain force on the first transistor and the second transistor. The method also forms a second stress-producing layer on the first stress-producing layer over the first transistor and the second transistor. The second stress-producing layer applies compressive strain force on the first stress-producing layer, the first transistor, and the second transistor.

Another exemplary method embodiment of manufacturing an integrated circuit structure forms at least one pair of complementary transistors on or in a wafer. The pair of complementary transistors comprise a first transistor and a second transistor. The method forms a first stress-producing layer on both the first transistor and the second transistor. The first stress-producing layer applies tensile strain force on the first transistor and the second transistor. The method also forms a second stress-producing layer on the first stress-producing layer over the first transistor and the second transistor. The second stress-producing layer applies compressive strain force on the first stress-producing layer, the first transistor, and the second transistor. A difference in thickness between the first stress-producing layer and the second stress-producing layer alter the performance of the first transistor and the second transistor.

DETAILED DESCRIPTION OF THE INVENTION

As mentioned above, many new forms of strain producing liners (such as dual stress liners) are being utilized with modern integrated circuit devices. However, for low power applications, dual stress liners create gate induced drain leakage (GIDL) problems in the channel interface regions of the transistors. In view of these issues, the embodiments herein utilizes different straining layers that do not produce problems that conventional straining layers produce.

Figure 1:
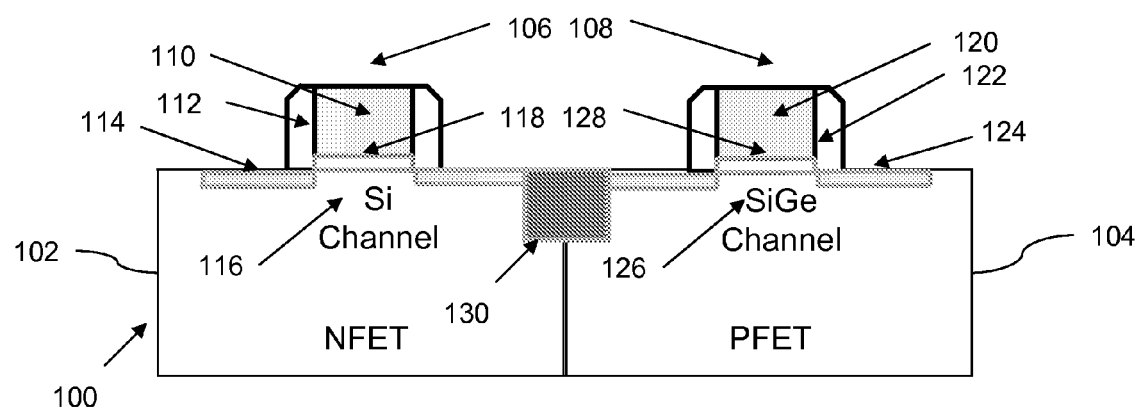
FIG. 1 is a schematic cross-sectional diagram of an integrated circuit structure according to embodiments herein.
Figure 2:
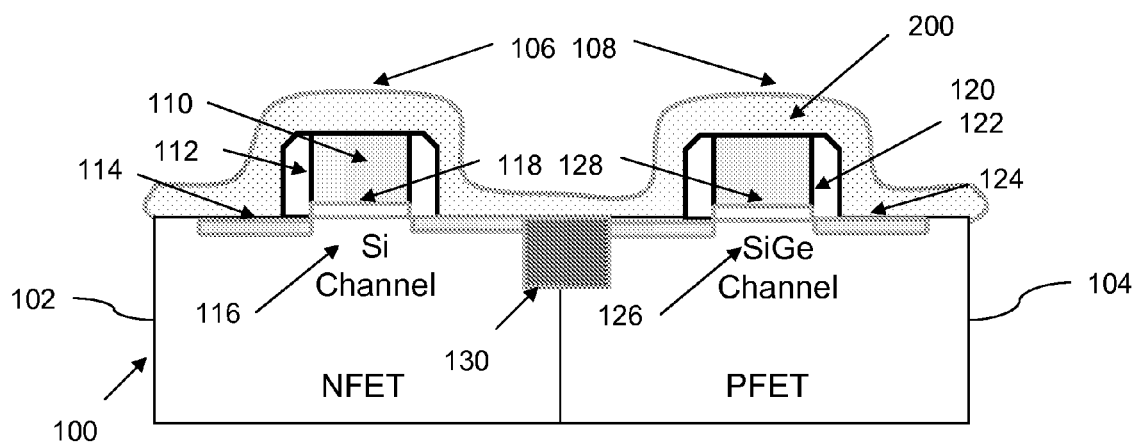
FIG. 2 is a schematic cross-sectional diagram of an integrated circuit structure according to embodiments herein.
Figure 3:
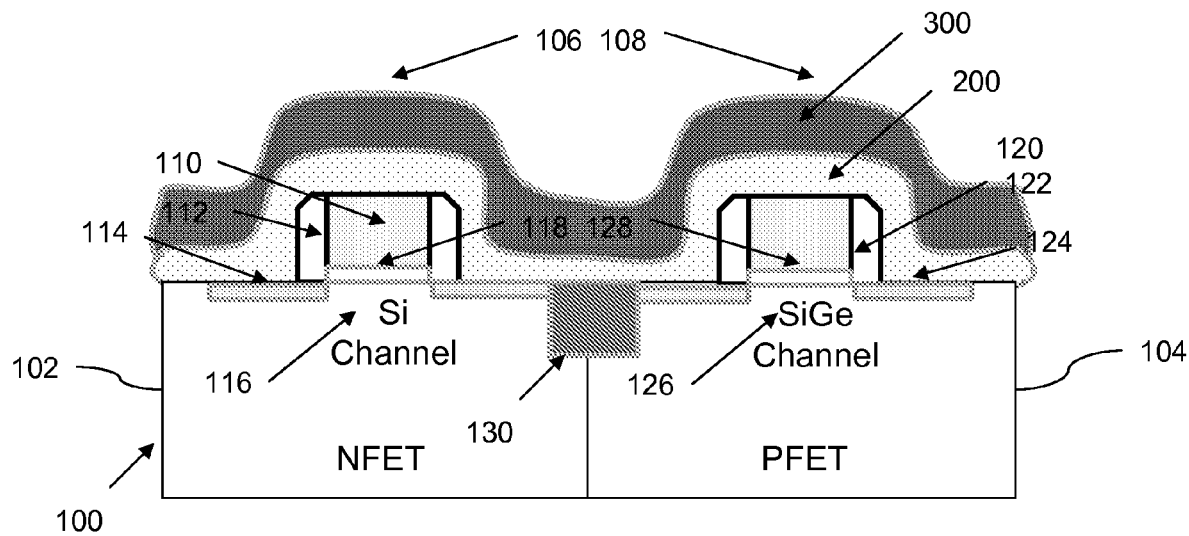
FIG. 3 is a schematic cross-sectional diagram of an integrated circuit structure according to embodiments herein.

More specifically, one example of the embodiments herein is shown in FIGS. 1-3. In FIGS. 1-3 illustrate the formation of an integrated circuit structure that includes a substrate 100. The substrate 100 includes different regions including negative-type (N-type) field effect transistor (NFET) regions 102 and positive-type (P-type) field effect transistor (PFET) regions 104.

This embodiment includes at least one pair of complementary metal oxide (CMOS) transistors on or in the substrate 100. The pair of complementary transistors comprises a first transistor 106 and a second transistor 108. The first transistor 106 in this example comprises a negative-type (N-type) transistor and the second transistor 108 comprises a positive-type (P-type) transistor.

Generally, such transistor structures are formed by depositing or implanting impurities into a substrate 100 to form at least one semiconductor channel region 116, 126 bordered (separated) by shallow trench isolation regions 130 below the upper surface of the substrate 100, as shown in FIG. 1. The second transistor 108 comprises a silicon germanium channel 126, while the first transistor comprises a silicon channel free of germanium 116.

The substrate 100 can comprise any material appropriate for the given purpose (whether now known or developed in the future) and can comprise, for example, Si, SiC, SiGe, SiGeC, Ge alloys, GaAs, InAs, TnP, other III-V or II-VI compound semiconductors, or organic semiconductor structures etc. The impurities can comprises any negative-type impurity (N-type impurity, e.g., phosphorus (P), arsenic (As), antimony (Sb) etc.) or any positive-type impurity (P-type impurity, e.g., boron, indium, etc.). The different channel regions 116, 126 are doped differently depending upon whether the transistor will be a positive-type or a negative-type transistor. As illustrated in FIG. 2, the transistors 106, 108 are complimentary to each other and are therefore opposite type polarity transistors.

The implantation processes mentioned herein can take any appropriate form (whether now known or developed in the future) and can comprise, for example, ion implantation, etc. Also see U.S. Pat. No. 6,815,317 (incorporated herein by reference) for a full discussion of implantation techniques. Shallow trench isolation (STI) structures are well-known to those ordinarily skilled in the art and are generally formed by patterning openings within the substrate and growing or filling the openings with a highly insulating material.

The method forms a gate dielectric 118, 128 on the upper surface of the substrate 100 over the semiconductor channel region 116, 126 and patterns a gate conductor 110, 120 on the gate dielectric 118, 128 over the semiconductor channel region 116, 126 as shown in FIG. 1. The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide. The thickness of dielectrics herein may vary contingent upon the required device performance.

As shown in FIG. 1, the gate conductor 110, 120 has sidewalls. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, and may be deposited using physical vapor deposition, chemical vapor deposition, or any other technique known in the art.

As shown in FIG. 1, the method forms sidewall spacers 112, 122 on the sidewalls of the gate conductor 110, 120. Sidewall spacers are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

Using the sidewall spacers 112, 122 as an alignment feature, any of the impurities mentioned above are implanted into the substrate to form the source and drain regions 114, 124. Again, the different transistors 106, 108 will utilizes different polarity dopants depending upon the polarity of the transistor for the source and drain regions.

The exposed portions of the silicon are then silicided by depositing a metal (such as, tungsten, hafnium, tantalum, molybdenum, titanium, nickel, etc.) and then heating the structure in a thermal annealing process. This produces silicides on the source and drain regions and silicides on the gate conductors 110, 120.

Thus, the standard CMOS transistor structures shown in FIG. 1, comprise at least one first-type field effect transistor 106 and at least one second-type field effect transistor 108. The first-type field effect transistor 106 and the second-type field effect transistor 108 each comprise source and drain regions 114, 124, a channel region between the source and drain regions 116, 126, a gate conductor 110, 120 adjacent the channel region 116, 126, a gate insulator 118, 128 between the channel region 116, 126 and the gate conductor 110, 120, and a silicide layer on the gate conductor and the source and drain regions While only one of each type of transistor is illustrated in FIG. 1, those ordinarily skilled in the art would understand that many of each type of transistor could be formed on the substrate 100 and the drawings are intended to show multiple ones of each of the different types of transistors; however, the drawings have been simplified to only show a single transistor of each type for clarity and to allow the reader to more easily recognize the different features illustrated. This is not intended to limit the invention because, as would be understood by those ordinarily skilled in the art, the invention is applicable to structures that include many of each type of transistor.

As shown in FIG. 2, a first stressing layer 200 is formed over the structure and cured. When the stressing layer 200 cures, its size changes, which produces either compressive or tensile stress within the channel regions 116, 126, to increase the performance of the channel regions 116, 126. The first stressing layer 200 is positioned over both the first transistor 106 and the second transistor 108.

As shown in FIG. 3, a second stress-producing layer 300 is formed on the first stress-producing layer 200 (over both the first transistor 106 and the second transistor 108). The first stress-producing layer 200 and the second stress-producing layer 300 comprise, for example, deposited or grown silicon-germanium, silicon-nitride, silicon-carbon, etc.

The first stress-producing layer 200 applies tensile strain force on the first transistor 106 and the second transistor 108. The second stress-producing layer 300 applies compressive strain force on the first stress-producing layer 200, the first transistor 106, and the second transistor 108.

The first stress-producing layer 200 and the second stress-producing layer 300 can be of different thicknesses, and the difference in thickness between the first stress-producing layer 200 and the second stress-producing layer 300 alters performance of the first transistor 106 and the second transistor 108.

The structure shown in FIG. 3 comprises a complementary transistor structure that utilizes a dual straining layer. However, rather than using different straining layers over the different transistors, the embodiments herein use the same straining layers over the different transistors. By doing so, straining layers do not have to be removed from one of the transistors (as is done conventionally with dual straining layers) and the manufacturing process is thereby simplified and the yield is increased.

Figure 4:
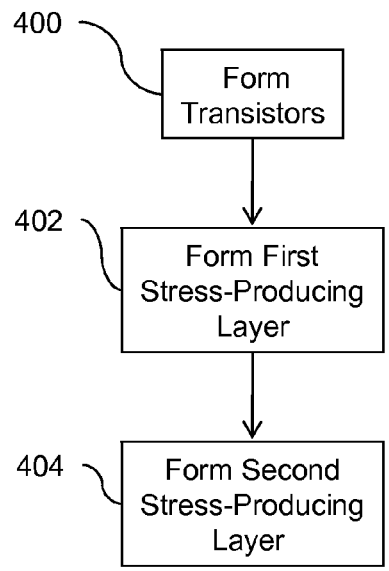
FIG. 4 is a flow diagram illustrating one exemplary method embodiment herein.

The foregoing embodiments are also illustrated in flowchart form in FIG. 4. More specifically, in FIG. 4, the processing shown in FIGS. 1-3 begins in item 400 where the transistors are formed in or on the substrate. In item 402, this embodiment forms the first stress-producing layer; and in item 404, the second stress-producing layer is formed.

Therefore, the present embodiments overcome the problems of conventional structures by utilizing straining layers that improve the performance of transistors without causing gate induced drain leakage problems.

The resulting integrated circuit chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

The invention claimed is:

1. An integrated circuit structure comprising:
    a substrate;
    at least one pair of complementary transistors one of on and in said substrate, said pair of complementary transistors comprising a first transistor and a second transistor;
    a first stress-producing layer on said first transistor and said second transistor; and
    a second stress-producing layer on said first stress-producing layer over said first transistor and said second transistor,
    said first stress-producing layer applying tensile strain force on said first transistor and said second transistor, and
    said second stress-producing layer applying compressive strain force on said first stress-producing layer, said first transistor, and said second transistor.

2. The integrated circuit structure according to claim 1, said pair of complementary transistors comprising complementary metal oxide (CMOS) transistors.

3. The integrated circuit structure according to claim 1, said first transistor comprising a negative-type (N-type) transistor and said second transistor comprising a positive-type (P-type) transistor.

4. The integrated circuit structure according to claim 3, said second transistor comprising a silicon germanium channel and said first transistor comprising a silicon channel free of germanium.

5. The integrated circuit structure according to claim 1, said first stress-producing layer and said second stress-producing layer comprising at least one of silicon-germanium, silicon-nitride, and silicon-carbon.

6. An integrated circuit structure comprising:
    a substrate;
    at least one pair of complementary transistors one of on and in said substrate, said pair of complementary transistors comprising a first transistor and a second transistor;
    a first stress-producing layer on said first transistor and said second transistor; and
    a second stress-producing layer on said first stress-producing layer over said first transistor and said second transistor,
    said first stress-producing layer applying tensile strain force on said first transistor and said second transistor,
    said second stress-producing layer applying compressive strain force on said first stress-producing layer, said first transistor, and said second transistor,
    said first stress-producing layer and said second stress-producing layer comprising different thicknesses, and
    a difference in thickness between said first stress-producing layer and said second stress-producing layer altering performance of said first transistor and said second transistor.

7. The integrated circuit structure according to claim 6, said pair of complementary transistors comprising complementary metal oxide (CMOS) transistors.

8. The integrated circuit structure according to claim 6, said first transistor comprising a negative-type (N-type) transistor and said second transistor comprising a positive-type (P-type) transistor.

9. The integrated circuit structure according to claim 8, said second transistor comprising a silicon germanium channel and said first transistor comprising a silicon channel free of germanium.

10. The integrated circuit structure according to claim 6, said first stress-producing layer and said second stress-producing layer comprising at least one of silicon-germanium, silicon-nitride, and silicon-carbon.

11. A method of manufacturing an integrated circuit structure, said method comprising:
    forming at least one pair of complementary transistors one of on and in a wafer, said pair of complementary transistors comprising a first transistor and a second transistor; and
    forming a first stress-producing layer on said first transistor and said second transistor, said first stress-producing layer applying tensile strain force on said first transistor and said second transistor; and forming a second stress-producing layer on said first stress-producing layer over said first transistor and said second transistor, said second stress-producing layer applying compressive strain force on said first stress-producing layer, said first transistor, and said second transistor.

12. The method according to claim 11, said forming of said transistors comprising forming said first transistor as a negative-type (N-type) transistor and said second transistor as a positive-type (P-type) transistor.

13. The method according to claim 12, said forming of said transistors comprising forming said second transistor to have a silicon germanium channel and said first transistor to have a silicon channel free of germanium.

14. The method according to claim 12, said forming of said transistors comprising forming said first transistor to have a silicon germanium channel and said second transistor to have a gallium arsenide channel.

15. The method according to claim 11, said forming of said stress-producing layer comprising forming a layer of at least one of silicon-germanium, silicon-nitride, and silicon-carbon.

16. A method of manufacturing an integrated circuit structure, said method comprising:
 forming at least one pair of complementary transistors one of on and in a wafer, said pair of complementary transistors comprising a first transistor and a second transistor; and
 forming a first stress-producing layer on said first transistor and said second transistor, said first stress-producing layer applying tensile strain force on said first transistor and said second transistor; and
 forming a second stress-producing layer on said first stress-producing layer over said first transistor and said second transistor, said second stress-producing layer applying compressive strain force on said first stress-producing layer, said first transistor, and said second transistor,
 a difference in thickness between said first stress-producing layer and said second stress-producing layer altering performance of said first transistor and said second transistor.

17. The method according to claim 16, said forming of said transistors comprising forming said first transistor as a negative-type (N-type) transistor and said second transistor as a positive-type (P-type) transistor.

18. The method according to claim 17, said forming of said transistors comprising forming said second transistor to have a silicon germanium channel and said first transistor to have a silicon channel free of germanium.

19. The method according to claim 17, said forming of said transistors comprising forming said first transistor to have a silicon germanium channel and said second transistor to have a gallium arsenide channel.

20. The method according to claim 16, said forming of said stress-producing layer comprising forming a layer of at least one of silicon-germanium, silicon-nitride, and silicon-carbon.

* * * * *